United States Patent
Yang et al.

(10) Patent No.: US 7,651,892 B2
(45) Date of Patent: Jan. 26, 2010

(54) ELECTRICAL PROGRAMMABLE METAL RESISTOR

(75) Inventors: Chih-Chao Yang, Poughkeepsie, NY (US); Lawrence A. Clevenger, LaGrangeville, NY (US); James J. Demarest, Fishkill, NY (US); Louis C. Hsu, Fishkill, NY (US); Carl Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 654 days.

(21) Appl. No.: 11/535,833

(22) Filed: Sep. 27, 2006

(65) Prior Publication Data
US 2008/0132058 A1 Jun. 5, 2008

Related U.S. Application Data

(62) Division of application No. 10/908,360, filed on May 9, 2005, now Pat. No. 7,122,898.

(51) Int. Cl.
*H01L 21/20* (2006.01)
*H01L 21/82* (2006.01)
*H01L 21/44* (2006.01)

(52) U.S. Cl. .................. 438/131; 438/385; 438/600; 438/627; 438/643; 257/E21.577; 257/E21.579

(58) Field of Classification Search .......... 438/131, 438/132, 385, 600, 601, 627, 643; 257/E21.577, 257/E21.579
See application file for complete search history.

(56) References Cited

U.S. PATENT DOCUMENTS

| 5,485,138 | A | 1/1996 | Morris |
| 6,083,785 | A | 7/2000 | Segawa et al. |
| 6,207,560 | B1 | 3/2001 | Lee |
| 6,232,042 | B1 | 5/2001 | Dunn et al. |
| 7,247,946 | B2 * | 7/2007 | Bruley et al. ............. 257/751 |
| 7,276,796 | B1 * | 10/2007 | Yang et al. ............... 257/751 |
| 2004/0027234 | A1 | 2/2004 | Hashimoto et al. |
| 2004/0134769 | A1 | 7/2004 | Wang et al. |
| 2005/0029662 | A1 | 2/2005 | Nakano et al. |
| 2006/0057835 | A1 | 3/2006 | Anderson et al. |
| 2008/0042282 | A1 * | 2/2008 | Saito et al. ............... 257/751 |
| 2008/0211097 | A1 * | 9/2008 | Kawahara et al. ......... 257/751 |
| 2009/0098730 | A1 * | 4/2009 | Oh et al. .................. 438/660 |
| 2009/0149018 | A1 * | 6/2009 | Takewaki ................. 438/625 |

* cited by examiner

*Primary Examiner*—Ngan Ngo
(74) *Attorney, Agent, or Firm*—Scully, Scott, Murphy & Presser, P.C.; Katerine S. Brown, Esq.

(57) ABSTRACT

The present invention provides an electrical programmable metal resistor and a method of fabricating the same in which electromigration stress is used to create voids in the structure that increase the electrical resistance of the resistor. Specifically, a semiconductor structure is provided that includes an interconnect structure comprising at least one dielectric layer, wherein said at least one dielectric layer comprises at least two conductive regions and an overlying interconnect region embedded therein, said at least two conductive regions are in contact with said overlying interconnect region by at least two contacts and at least said interconnect region is separated from said at least one dielectric layer by a diffusion barrier, wherein voids are present in at least the interconnect region which increase the electrical resistance of the interconnect region.

9 Claims, 8 Drawing Sheets

ELECTRICAL PROGRAMMABLE METAL RESISTOR

RELATED APPLICATIONS

This application is a divisional of U.S. patent application Ser. No. 10/908,360, filed May 9, 2005 now U.S. Pat. No. 7,122,898.

FIELD OF THE INVENTION

The present invention relates to a semiconductor structure and a method of fabricating the same. More particularly, the present invention provides an electrical programmable metal resistor and a method of fabricating the same in which electromigration stress is used to create voids in the structure that increase the resistance of the resistor.

BACKGROUND OF THE INVENTION

In semiconductor devices, it is well known to have thin film resistors embedded in the back-end-of-the-line (BEOL) of the chip through either a damascene process or a subtractive etch method. BEOL thin film resistors are preferred over other types of resistors because of lower parasitics. However, the sheet resistivity of the various resistors formed over the entire wafer may vary and go beyond specifications due to poor process control. In an advanced manufacturing line, wafers out of specification are often scrapped for quality control.

The resistor is one of the most common electrical components used in almost every electrical device. Conventionally, doped polysilicon is used as the material of a resistor. However, the conventional resistor can only provide a limited resistance within a limited dimension as manufactures keep shrinking the device feature size down. To overcome this problem, new materials with higher resistivity and new integrations are required for fabrication of thin film resistors in a highly integrated semiconductor device.

Resistive thin films such as CrSi and TaN are often used as resistors in semiconductor devices. Integration schemes used to fabricate the resistor components within the interconnect structure fall into two primarily categories. In the first integration scheme, a thin film resistor is formed, by etching on top of an insulator. A metallic layer is deposited on top of the resistive layer and is used to protect the resistor layer from being damaged during the sequential etching process. After the resistor has been defined, the underlying dielectric layer is then patterned and etched to define the interconnect pattern. Finally, a metallic layer for the interconnect is deposited, patterned and etched. Although the protective layer is capable of protecting the resistive layer, the provided protection is limited and the resistive layer may still be damaged during the etching process. This integration scheme is disclosed, for example, in U.S. Pat. No. 6,207,560.

In the second integration scheme, a thin film resistor is formed, by etching on top of an insulator. An interlevel dielectric is then deposited, followed by patterning and etching processes to define an upper level interconnect structure with vias connected to the underlying thin film resistor. A planarization process is usually required after deposition of the interlevel dielectric material in order to compromise any possible topography related issues caused by the underlying resistors.

Some additional prior art disclosures of BEOL resistors and methods of fabricating the same include, for example: U.S. Patent Application Publication No. 2004/0027234, U.S. Pat. Nos. 6,232,042, 6,207,560, 6,083,785, and 5,485,138.

Resistors can be trimmed by using laser or high-energy particle beams in order to set the resistance of the resistor. The prior art trimming processes are not clean and therefore have never become a common practice. Resistors can also be programmed by using a shut resistor to deselect at least a portion of the resistor from a chain of resistors within a circuit. This prior art method has two problems; first the resolution of the programming is limited by the least significant bit device size. Secondly, the shut device itself has some resistance. The tuning precision is thus poor.

In view of the above, there is a need to provide a BEOL resistor that can be electrically programmed without the need of using prior art shut resistors and wherein the resistance of the resistor can be set without the need of using prior art trimming methods.

SUMMARY OF THE INVENTION

It is an object of the present invention to provide a BEOL structure with an interconnect and a thin film resistor at the same level. It is another object of the present invention to provide a process that is BEOL compatible that does not require an extra mask or extra materials to fabricate the thin film resistor.

Electromigration (EM) effect has long been identified as a reliability related phenomenon inside a biased metal interconnect. Voids are formed inside the biased metal interconnect due to metal ion movement caused by high density of current flow. In short, electromigration is caused by a positive divergence of the ionic flux, which leads to an accumulation of vacancies, forming a void in the metal. It appears that ions are moved "downstream" by the force of "electron wind". In general, the void creating rate inside the metal is a function of current density and temperature.

The present invention provides a method of adopting electromigration (EM) stress as a required process step for chip manufacturing. A diffusion barrier is used as an electrical path around anode(s) within the inventive structure after the EM stress and the resulting electrical resistance can be modulated via controlling the stress time.

The present invention offers the following advantages over the prior art: (i) No etch stop material is required to be located over the thin film resistors, (ii) the thin film resistor can be photographically defined and etched rather than be defined by lift-off, (iii) the resistance of the structure is determined by the void size inside the structure which is a direct result of EM stress application which offers a feature of better resistor control, and (iv) the inventive process is compatible to current BEOL process flow, and no extra mask/material is required for creating the resistor structure.

In addition to an extra mask being required in the prior art for fabricating a BEOL thin film resistor structure, the prior art processes are complicated which also increases the manufacturing costs. Since the present invention does not require an extra mask and relatively simple and BEOL compatible processing steps are used, the inventive method does not add additional manufacturing costs to the fabrication process.

In broad terms, the present invention provides a semiconductor structure that comprises:

an interconnect structure comprising at least one dielectric layer, wherein said at least one dielectric layer comprises at least two conductive regions and an overlying interconnect region embedded therein, said at least two conductive regions are in contact with said overlying interconnect region by at least two contacts and at least said interconnect region is separated from said at least one dielectric layer by a diffusion barrier, wherein voids are present in at least the interconnect region which increase the electrical resistance of the interconnect region.

In one embodiment of the present invention, the interconnect structure is a single damascene interconnect structure including a first dielectric and a second dielectric layer located atop the first dielectric. In this embodiment, the at least one conductive region and the at least two contacts are located in the first dielectric layer and the interconnect region is located in the second dielectric layer. In such an embodiment, the voids are located mainly within the interconnect region. A capping layer is present in the interconnect structure and it is located atop the second dielectric and the interconnect region.

In another embodiment of the present invention, the interconnect structure is a dual damascene interconnect structure including a first dielectric layer that includes the conductive regions, and a second dielectric that includes the contacts and the interconnect region embedded therein. In this embodiment, both the interconnect region and the contacts are separated from the second dielectric by the diffusion barrier. In the embodiment including this dual damascene interconnect structure, the voids are located within the interconnect region as well as the contacts. A capping layer is also present atop the second dielectric layer and the interconnect region in this interconnect structure as well.

In yet another embodiment of the present invention, the interconnect structure is also a dual damascene structure in which another interconnect level is located thereon. In this embodiment, the voids are located within the interconnect region at the footprints of the overlying conductively filled vias that are present in the other interconnect level. A capping layer is also present atop the second dielectric layer and the interconnect region in this interconnect structure as well.

It is noted that in the inventive structure defined above, the interconnect region is the thin film resistor of the present invention which is embedded within one of the dielectric layers of an interconnect (single or dual damascene) structure. The presents of the voids controls the electrical resistance of the interconnect region and thus the resistor.

In addition to the structure provided above, the present invention also provides a method of fabricating the same. The method of the present invention broadly includes the steps of:

providing an interconnect structure comprising at least one dielectric layer, wherein said at least one dielectric layer comprises at least two conductive regions and an overlying interconnect region embedded therein, said at least two conductive regions are in contact with said overlying interconnect region by at least two contacts and at least said interconnect region is separated from said at least one dielectric layer by a diffusion barrier; and applying an electrical bias between two of said contacts under electromigration stress conditions to form voids in the interconnect region which increase the electrical resistance of the interconnect region.

The electromigration stress conditions that are capable of forming the voids in the interconnect region comprise biasing using a current of greater than 5 mA/$\mu m^2$ at a temperature of greater than about 80° C.

The located of the voids is dependent on whether a single or dual damascene interconnect structure is employed and whether an upstream stress mode or a downstream stress mode are employed. In an upstream stress mode, the electromigration stress causes electrons to flow upwards, while in the downstream stress mode the electrons flow down. These terms will be defined in greater detail herein below.

In addition to the above, the present invention also provides a programmable circuit that includes:

an interconnect structure comprising at least one dielectric layer, wherein said at least one dielectric layer comprises at least two conductive regions and an overlying interconnect region embedded therein, said at least two conductive regions are in contact with said overlying interconnect region by at least two contacts and at least said interconnect region is separated from said at least one dielectric layer by a diffusion barrier, wherein voids are present in at least the interconnect region which increase the resistance of the interconnect region and said interconnect region includes a first and second node and is coupled to a voltage output pin;

a series of switches in contact with said interconnect region, said series of switches are coupled to a voltage input pin; and a decoder coupled independently to each of said switches, said decoder providing bit addresses that are based on output data received from each of the switches.

DETAILED DESCRIPTION OF THE INVENTION

The present invention, which provides an interconnect structure with a thin film resistor at the same level as the interconnect and a method of adopting electromigration (EM) stress as a processing step for chip manufacturing, will now be described in greater detail by referring to the drawings that accompany the present application. It is noted that the drawings of the present invention are provided for illustrative purposes and thus they are not drawn to scale. In the drawings, like reference numerals are used for describing like and corresponding elements.

Figure 1A:
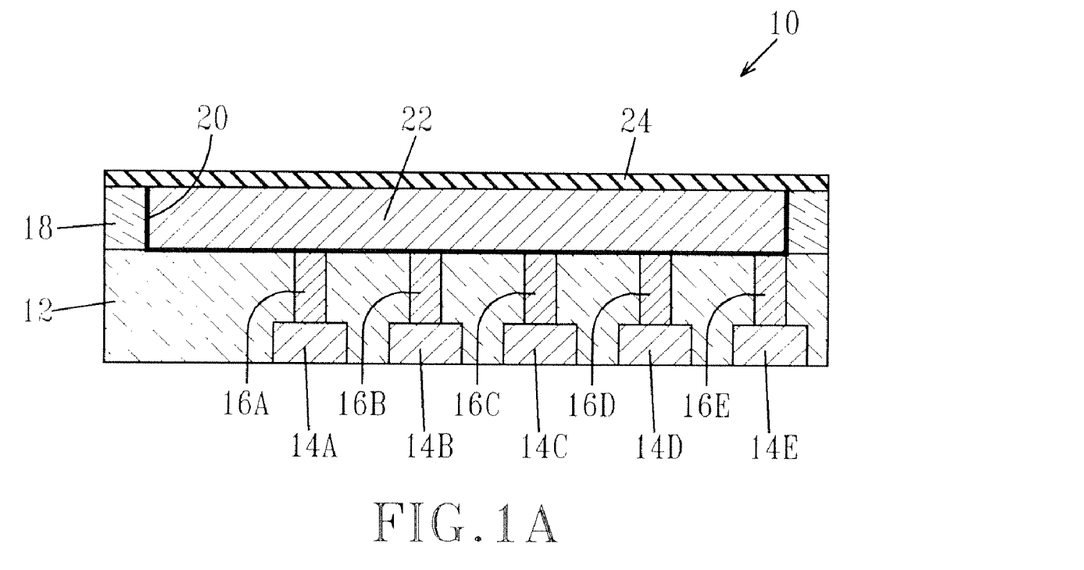
FIGS. 1A-1E are pictorial representations (through cross section views) illustrating the basic processing steps employed in one embodiment of the present invention.

Reference is first made to FIGS. 1A-1E which illustrate one of the embodiments of the present invention. In this embodiment of the present invention, a single damascene process is used and electromigration of electrons for void formation occurs via an upstream stress mode. Reference is first made to FIG. 1A, which illustrates an initial interconnect structure 10 that is used in the present invention. The initial interconnect structure 10 shown in FIG. 1A comprises one of the interconnect levels of an interconnect structure. The interconnect level illustrated in FIG. 1A is fabricated using a single damascene process which is well known to those skilled in the art of semiconductor interconnect technology.

The initial interconnect structure 10 illustrated in FIG. 1A is formed atop a substrate (not shown). The underlying substrate, which is not illustrated in the drawings of the present invention, may include a semiconducting material, an insulating material, a conductive material or any combination thereof, including multilayered structures. Thus, for example, the underlying substrate can be a semiconducting material such as Si, SiGe, SiGeC, SiC, GaAs, InAs, InP and other III/V or II/VI compound semiconductors. The semiconducting structure can also include a layered substrate such as, for example, Si/SiGe, Si/SiC, a silicon-on-insulator (SOI) or a silicon germanium-on-insulator.

When the underlying substrate is an insulating material, the insulating material can be an organic insulator, an inorganic insulator or a combination thereof, including multilayers. When the underlying substrate is comprised of a conductive material, the substrate may include, for example, polysilicon, an elemental metal, alloys of elemental metals, a metal silicide, a metal nitride or a combination thereof, including multilayers.

In some embodiments, the underlying substrate includes a combination of a semiconducting material and an insulating material, a combination of a semiconducting material and a conductive material or a combination of a semiconducting material, an insulating material and a conductive material.

When the underlying substrate comprises a semiconductor material, one or more semiconductor devices such as, for example, complementary metal oxide semiconductor (CMOS) devices can be fabricated thereon. For clarity, the one or more semiconductor devices are not shown in the drawings of the present application.

The initial interconnect structure 10 shown in FIG. 1A comprises a first dielectric layer 12 having at least two conductive regions located therein. In the drawing, five conductive regions 14A, 14B, 14C, 14D and 14E are shown for illustrative purposes. The at least two conductive regions comprise a conductive material such as, for example, polysilicon, a conductive metal including, but not limited to: Al, Cu, W, and Ni, and other like conductors including alloys, silicides and conductive oxynitrides of the aforementioned conductive metals. Preferably, the at least one conductive region comprises one of the above-mentioned conductive metals, with Al and Cu being most preferred.

The first dielectric layer 12 may comprise an organic or inorganic dielectric that is porous or non-porous. Porous materials are formed by incorporating a porogen with the dielectric precursor that is removed from the dielectric after deposition by a thermal process. Examples of an inorganic dielectric that can be used as the first dielectric layer 12 are oxides such as $SiO_2$. One example of an organic dielectric that can be used in the present invention as the first dielectric layer 12 comprises a silicon-containing material such as a composition containing atoms of Si, C, O and H (SiCOH) also called C doped oxide or organosilicate glass. Another example of an organic dielectric that can be used as the first dielectric layer 12 is a thermosetting polyarylene ether. The term "polyarylene" is used herein to denote aryl moieties or inertly substituted aryl moieties which are linked together by bonds, fused rings, or inert linking groups such as oxygen, sulfur, sulfone, sulfoxide or carbonyl. In one embodiment of the present invention, the first dielectric is an inorganic dielectric such as $SiO_2$.

The first dielectric layer 12 typically has a dielectric constant from about 7.0 or less, with a dielectric constant from about 2.5 to about 4.0 being even more typical. All dielectric constants mentioned in the present application are relative to a vacuum unless otherwise noted. As indicated above, the first dielectric layer 12 may be porous or non-porous. When porous dielectrics are used, the dielectric constant of the porous material is less than the nonporous version of the same dielectric material.

The first dielectric layer 12 has a thickness that typically ranges from about 50 nm to about 4 μm, with a thickness from about 100 to about 500 nm being even more typical. The thickness of the first dielectric layer 12 is dependent upon the dielectric material employed as well as the deposition process that was used in forming the same. Illustrative examples of some deposition processes that can be used in forming the first dielectric layer 12 are chemical vapor deposition (CVD), plasma enhanced chemical vapor deposition (PECVD), high-density plasma deposition, pulsed PECVD, spin-on application and other like deposition techniques.

The first dielectric layer 12 also includes at least two contacts (i.e., vias) that connect the at least two conductive regions in the first dielectric layer to an overlying interconnect region. In FIG. 1A, five contacts (i.e., vias) 16A-16E are shown for illustrative purposes only. The contacts are comprised of a conductive material including, for example, W, Al, or Cu, with W contacts being more typical.

The initial interconnect structure 10 also includes a second dielectric layer 18 that is located atop the first dielectric layer 12. The second dielectric layer 18 may comprise the same or different dielectric as that of the first dielectric layer 12. Preferably, the second dielectric layer 18 is comprised of a dielectric material that differs in composition from that of the first dielectric layer 12. For example, when the first dielectric layer 12 is comprised of $SiO_2$, than the second dielectric layer 18 is comprised of an organic dielectric such as a carbon doped oxide or thermosetting polyarylene ether.

The second dielectric layer 18 is formed utilizing one of the above-mentioned deposition processes and the second dielectric layer 18 typically has a thickness from about 100 to about 450 nm.

The second dielectric layer 18 includes an interconnect region 22 that is located with an opening formed into the second dielectric layer. The interconnect region 22 shown in FIG. 1A represents the thin film resistor of the present invention. Prior to forming the interconnect region 22, the opening is lined with a diffusion barrier 20. The diffusion barrier 20 comprises one or more conductive materials including, for example, Ta, Ti, TaN, W, Ru or TiSiN. The diffusion barrier 20 is formed by a conventional deposition process such as, for example, plating, ALD (atomic layer deposition), CVD, sputtering, evaporation and other like deposition processes and the diffusion barrier 20 typically has a thickness from about 1 to about 80 nm.

The interconnect region 22 that is located within an opening formed into the second dielectric layer 18 is comprised of a conductive material including the same or different conductor as that of the at least one conductive regions. Typically, the interconnect region is comprised of a conductive metal such as, for example, Cu or Al.

The initial interconnect structure 10 also includes a capping layer 24 that is located atop the second dielectric layer 18 as well as atop the interconnect region 22. The capping layer 24 is comprised of a dielectric material including, for example, $Si_3NH_4$ or $Si_xC_y(N_zH)$. The capping layer 24 is formed by a conventional deposition process such as, for example, CVD or PECVD, and its' thickness is typically from about 10 to about 80 nm.

It is again emphasized that the initial interconnect structure 10 shown in FIG. 1A is formed utilizing a conventional single damascene process that is well known to those skilled in the art.

Figure 1B:
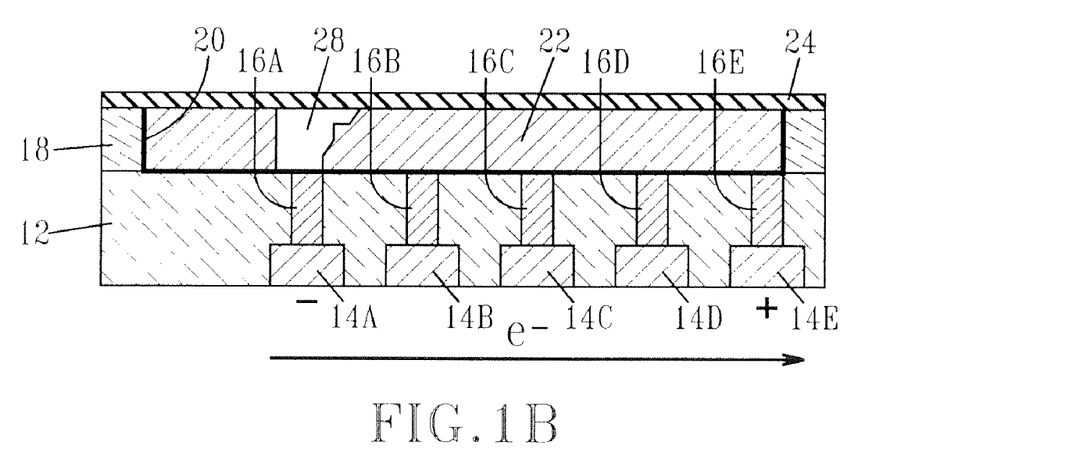

Electromigration is then carried out in the interconnect region 22 by applying an electrical bias between two of the contacts, e.g., contacts 16A and 16E, under stress conditions which are capable of forming void 28 in the interconnect region 22. That is, contacts 16A and 16E, for example, are used as a cathode and anode respectively, and an electrical bias is applied to the structure under a stress condition having a current of greater than 5 mA/μm$^2$ and at a temperature of greater than about 80° C. Specifically, the void 28 is formed into the interconnect region 22 by applying an electrical bias having a current from about 5 to about 1000 mA/μm and at a temperature from about 80° to about 500° C. In the embodiment depicted in FIG. 1B, the biasing causes electrons to flow from contact 16A to contact 16E in an upstream stress mode forming a void 28 above contact 16A. In FIG. 1B, the arrow under the structure shows the direction of electron flow during the electromigration process. The electrical resistance of the structure, particularly the interconnect region 22, is in-situ monitored during the electromigration process.

Figure 1C:
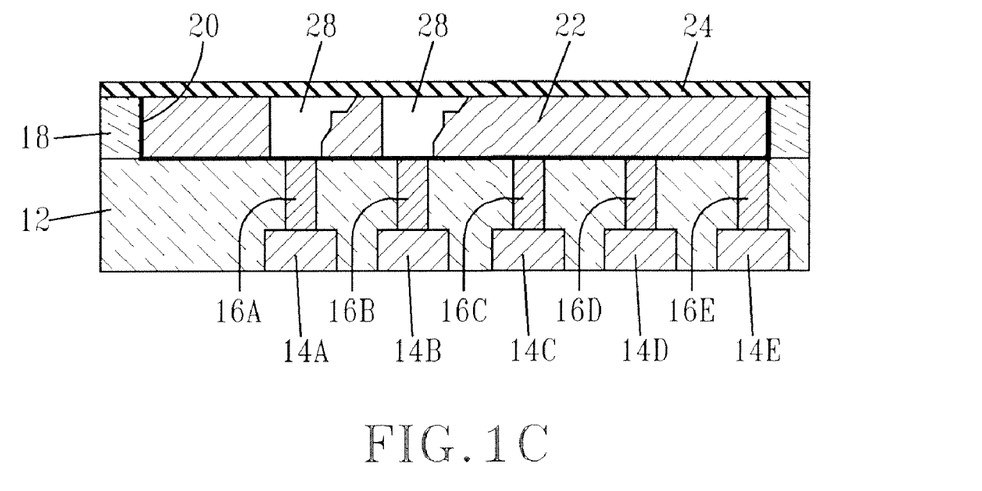
Figure 1D:
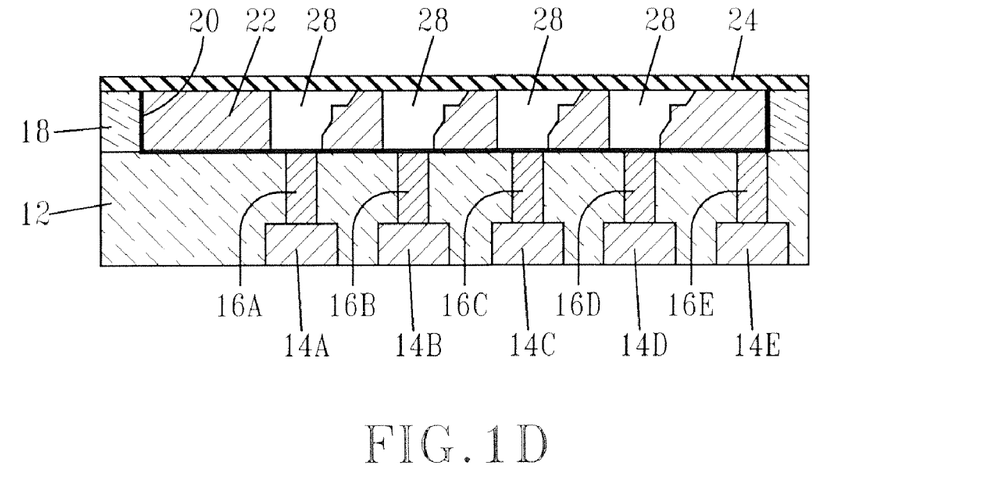
Figure 1E:
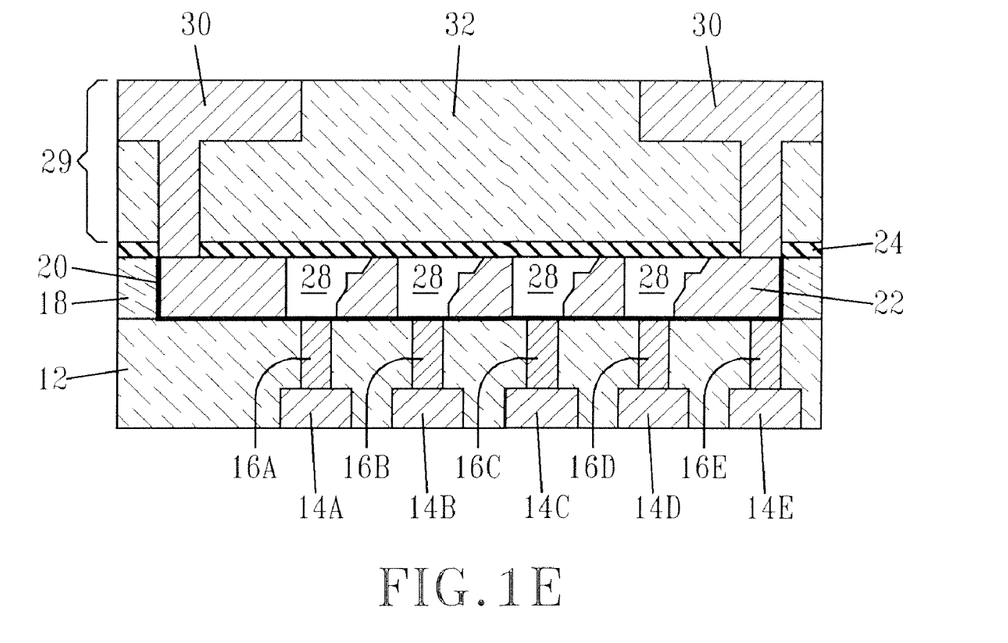

The electromigration process may be repeated any number of times to form further voids 28 in the interconnect region 22. Specifically, the electromigration process can be repeated any number of times depending upon the number of contacts that are present in the structure. FIGS. 1C and 1D show the structure after a series of electromigration processes. The conditions of the other electromigration processes are within the ranges mentioned above for the first electromigration process. A shown in FIG. 1C, a second void 28 is formed atop the contact 16B during the second electromigration process, a third void 28 and fourth void 28 is formed above the contact 16C and 16D during other electromigration processes.

After performing the desired number of electromigrations, an upper interconnect structure 29 comprising conductively filled lines and vias 30 that are embedded into a third dielectric layer 32 utilizing techniques well known in the art. This resultant structure is shown, for example, in FIG. 1E. The conductively filled lines and vias 30 are comprised of one of the above-mentioned conductive materials and the third dielectric layer 32 comprises one of the above-mentioned inorganic or organic dielectric materials. Additional interconnect structures, as desired, can be formed atop the structure shown in FIG. 1E.

Figure 2A:
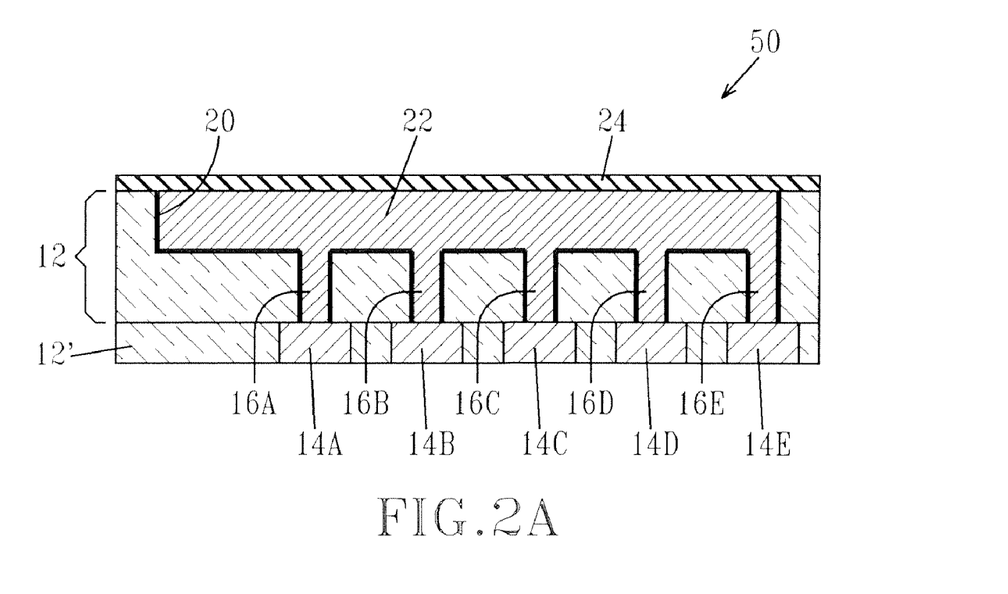
FIGS. 2A-2E are pictorial representations (through cross section views) illustrating the basic processing steps employed in another embodiment of the present invention.

FIGS. 2A-2E are pictorial representations of another embodiment of the present invention in which dual damascene technology is used together with an electromigration process that is operated in the upstream stress mode. FIG. 2A shows the initial dual damascene structure 50 that is located above a substrate as defined above. Structure 50 includes at least two conductive regions (14A-14E, for example) embedded within a first dielectric layer 12'. The initial dual damascene structure 50 also includes at least two contacts (16A-16E, for example) above the at least two conductive regions embedded with a second dielectric layer 12. The second dielectric layer 12 also includes an interconnect region 22 above the at least two contacts. The interconnect region 22 and the contacts are formed using photolithography and etching of the second dielectric layer 12. A diffusion barrier 20 is shown lining the via and line openings created by photolithography and etching. The initial dual damascene structure 50 also includes a capping layer 24 atop the second dielectric layer 12 and the interconnect region 22.

Figure 2B:
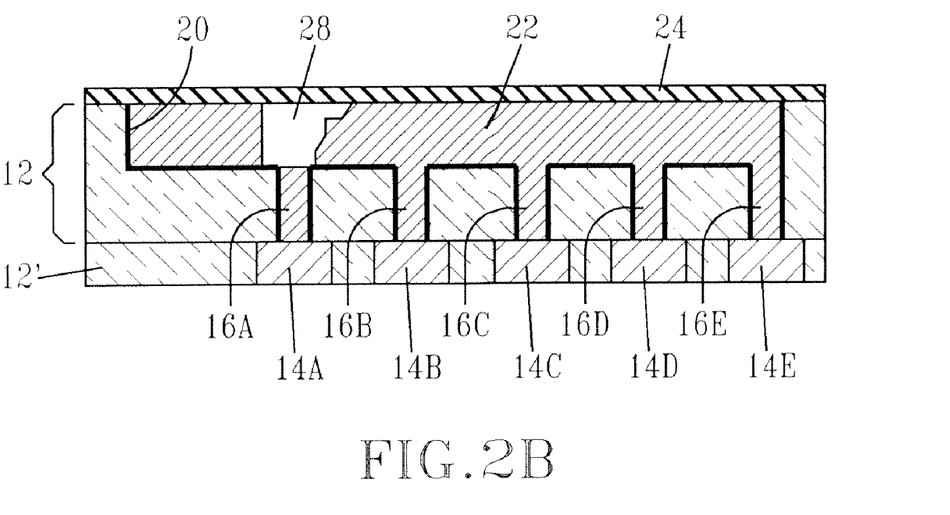
Figure 2C:
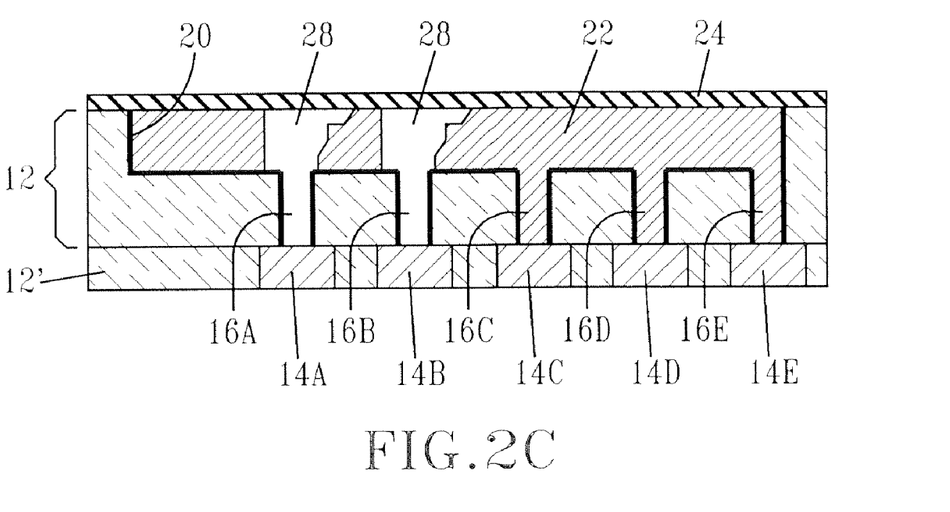
Figure 2D:
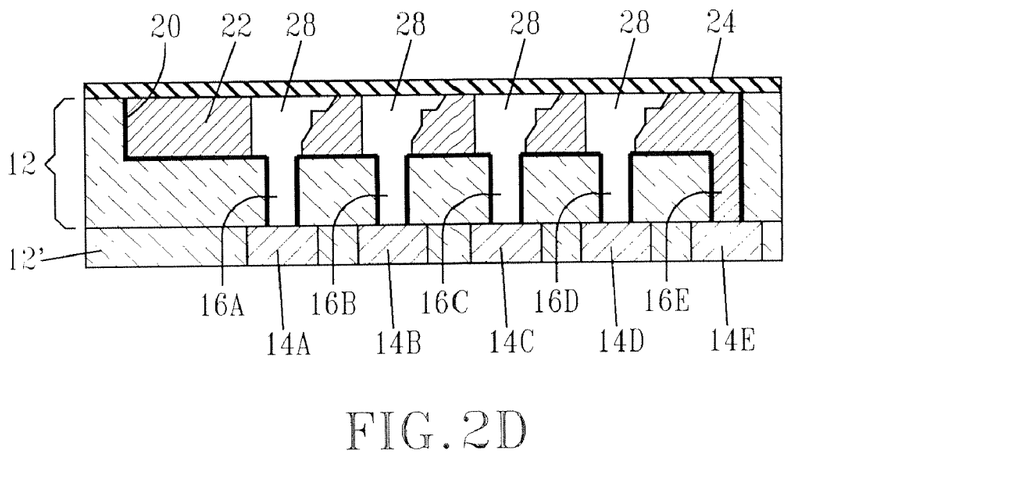

FIGS. 2B-2D shows the initial dual damascene structure 50 during various electromigration steps that are performed under stress conditions that are capable of forming voids 28 in the structure. In the dual damascene embodiment, the electromigration process forms voids 28 with the interconnect region and the contacts as shown.

Figure 2E:
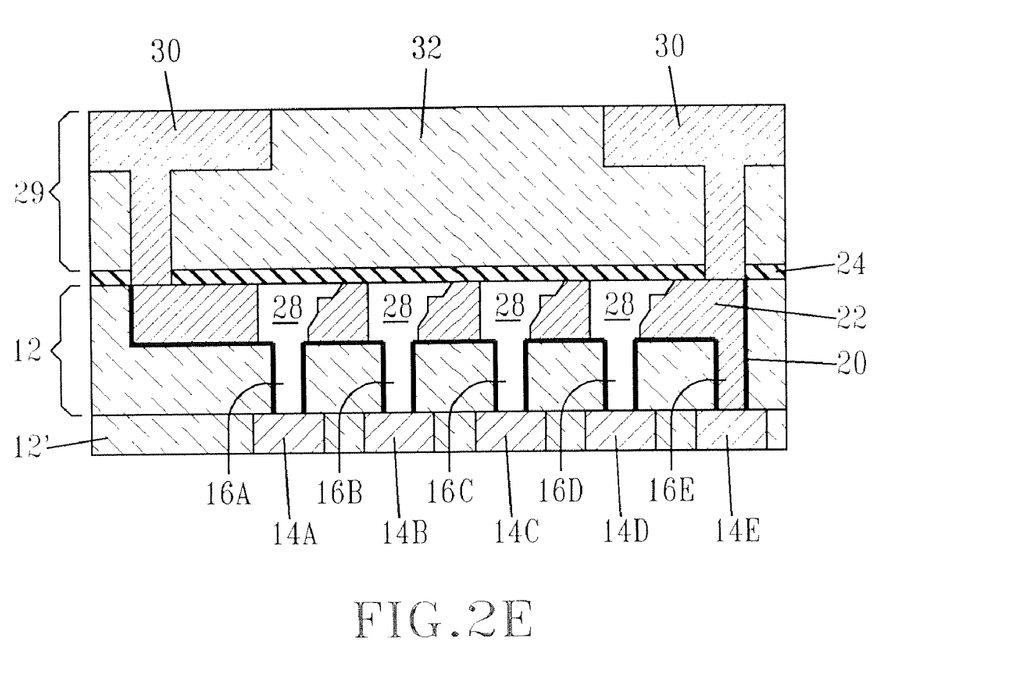

FIG. 2E shows the structure after forming an upper interconnect structure 29 including conductively filled lines and vias 30 embedded within a dielectric 32.

Figure 3A:
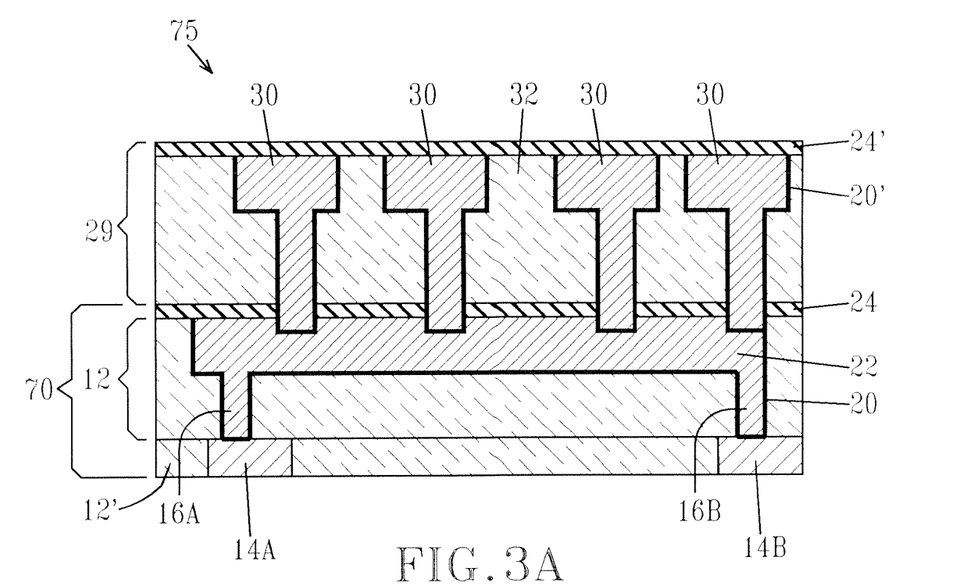
FIGS. 3A-3D are pictorial representations (through cross section views) illustrating the basic processing steps employed in yet another embodiment of the present invention.

FIGS. 3A-3D show an embodiment in which a dual damascene technique and a downstream stress electromigration mode are used. Reference is first made to FIG. 3A which shows an initial interconnect structure 75 that includes a lower interconnect structure 70 and an upper interconnect structure 29. The lower interconnect structure 70 includes a first dielectric layer 12' having at least two conductive regions (14A and 14B, for example) embedded therein and a second dielectric 12 including contacts (16A and 16B) and interconnect region 22. A diffusion barrier 20 lines the interconnect region 22 and the contacts. The lower interconnect structure 70 also including a capping layer 24 as described above atop the second dielectric layer 12 and the interconnect region 22. The upper interconnect structure 29 includes a third dielectric 32 having conductively filled vias and lines 30 embedded therein. A capping layer 24' is located above the upper interconnect structure 29 and a diffusion barrier 20' is also present in the disclosed structure.

Figure 3B:
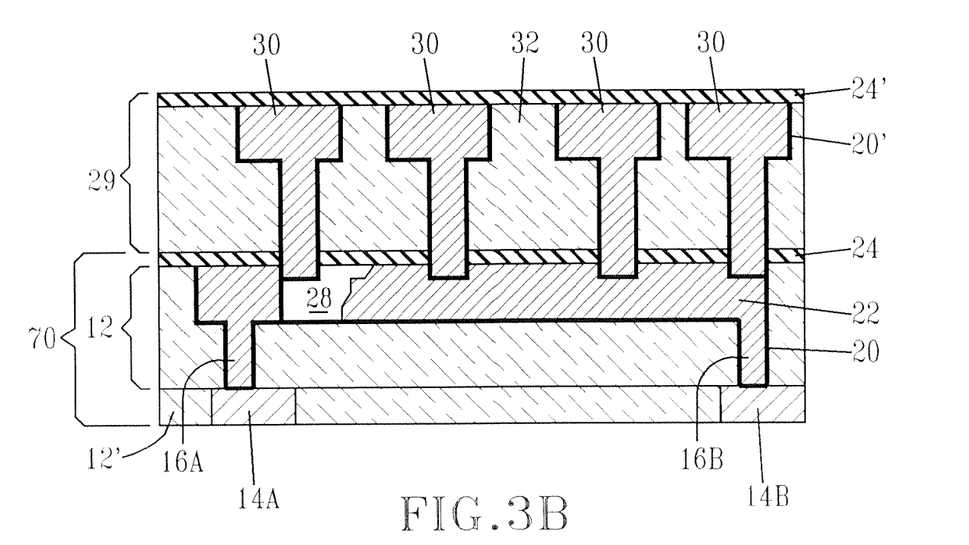
Figure 3C:
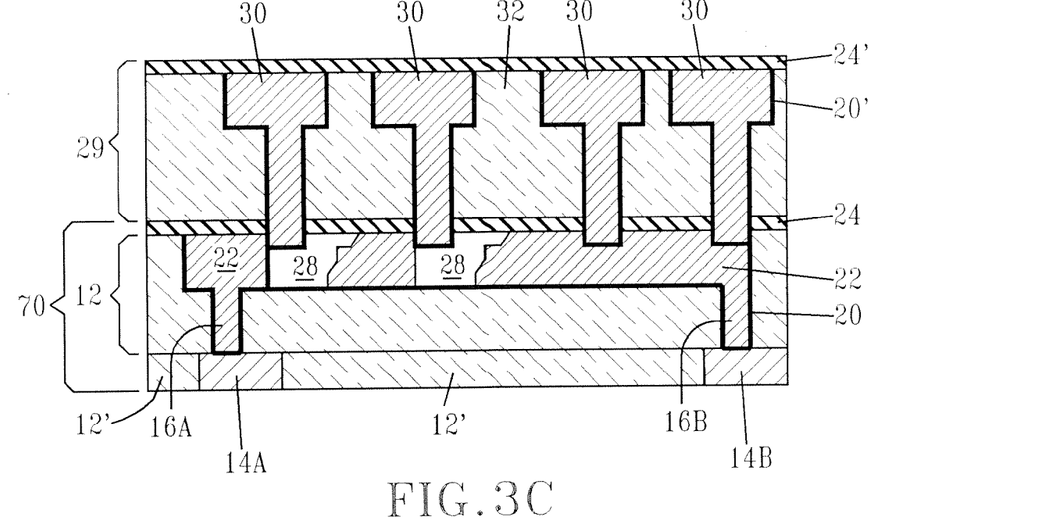
Figure 3D:
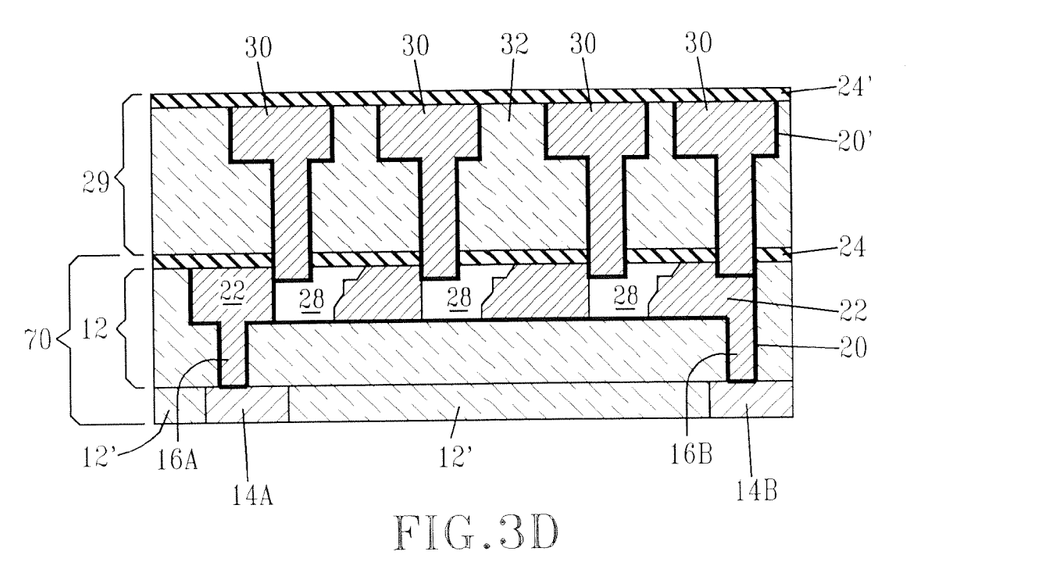

FIGS. 3B-3D show the structure during the various electromigration process which creates voids 28 in the structure. In the embodiment depicted, the voids 28 are formed in the interconnect region 22 that lies beneath the conductively filled vias of the upper interconnect structure 29. The electromigration process is conducted in this embodiment by applying an electrical bias between the conductively filled vias and lines of the upper interconnect structure 29. In this embodiment, the electrons flow from top interconnect 29 to bottom interconnect 22. The voids are formed utilizing the stress conditions mentioned above.

It should be noted that the interconnect region 22 shown in the above embodiments represents the resistor of the present invention. The electrical resistance of the resistor is determined by the void size with larger voids providing increased resistance. The size of the voids can be controlled by the electromigration process thus offering better resistor control. Moreover, tuning of the resistor can be automatically done using on-chip state-machine and algorithms. The methods described above provide a means for fabricating a high precision resistor.

Figure 4:
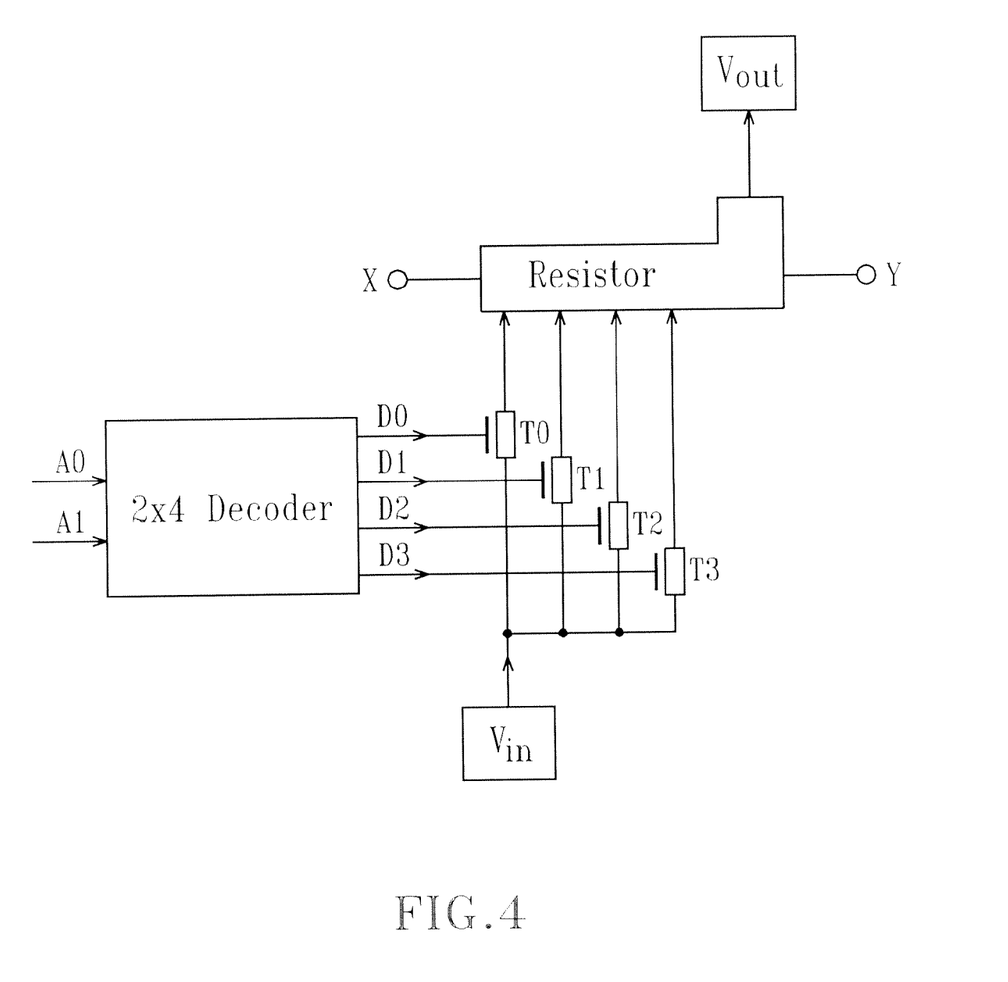
FIG. 4 is a schematic showing the programmable circuit of the present invention.

FIG. 4 shows a simple programmable circuit scheme that can include the inventive semiconductor structure. Here a 2×4 decoder taking a 2-bit address A0 and A1 generates four bit outputs D0 to D3. Each output controls a switch (i.e., T0 to T3) therefore each time only one switch is tuned on for EM programming. The two nodes of the resistor are X and Y. The program V$_{out}$ pin is intentionally attached at an extension side of the switch for two purposes: (1) the extension would have capacity which can be used to sink the metal during EM programming. (2) To keep the V$_{out}$ pin away from Y would avoid the programming effect that typically causes detrimental impact to the resistor thereby the resistor of the present invention maintains its accuracy.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

What is claimed is:

1. A method of fabricating a semiconductor structure comprising
   providing an interconnect structure comprising at least one dielectric layer, wherein said at least one dielectric layer comprises at least two conductive regions and an overlying interconnect region embedded therein, said at least two conductive regions are in contact with said overlying interconnect region by at least two contacts and said interconnect region is separated from said at least one dielectric layer by a diffusion barrier; and applying an electrical bias between two of said contacts under electromigration stress conditions to form voids in at least the interconnect region which increase the electrical resistance of the interconnect region.

2. The method of claim 1 wherein said providing said interconnect structure comprises a single or dual damascene process.

3. The method of claim 1 wherein said applying said electrical bias is repeated a number of times to create a plurality of voids within said interconnect region.

4. The method of claim 1 wherein said electromigration stress conditions comprise a current of greater than 5 mA/$\mu$m$^2$ at a temperature of greater than about 80° C.

5. The method of claim 1 wherein said electromigration stress conditions comprise a current of from about 5 to about 1000 mA/$\mu$m$^2$ and a temperature of from about 80° C. to about 500° C.

6. The method of claim 1 wherein said electromigration stress conditions cause electrons to flow upwards from one of the at least two contacts to said interconnect region.

7. The method of claim 1 wherein said electromigration stress conditions cause electrons to flow downwards from an overlying conductively filled via of an upper interconnect level to said interconnect region.

8. The method of claim 1 further comprising forming a capping layer on said interconnect structure.

9. The method of claim 1 wherein said diffusion barrier separates said at least one interconnect region from said at least one dielectric layer.

* * * * *

UNITED STATES PATENT AND TRADEMARK OFFICE
CERTIFICATE OF CORRECTION

PATENT NO. : 7,651,892 B2 Page 1 of 1
APPLICATION NO. : 11/535833
DATED : January 26, 2010
INVENTOR(S) : Yang et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 775 days.

Signed and Sealed this

Twenty-third Day of November, 2010

David J. Kappos
*Director of the United States Patent and Trademark Office*